United States Patent [19]

Shima et al.

[11] Patent Number: 5,161,166
[45] Date of Patent: Nov. 3, 1992

[54] SEMICONDUCTOR LASER

[75] Inventors: Akihiro Shima; Kunihiko Isshiki, both of Itami, Japan

[73] Assignee: Mitsubishi Denki Kabushiki Kaisha, Tokyo, Japan

[21] Appl. No.: 760,396

[22] Filed: Sep. 16, 1991

Related U.S. Application Data

[62] Division of Ser. No. 586,197, Sep. 20, 1990.

[30] Foreign Application Priority Data

Oct. 17, 1989 [JP] Japan .................. 1-271027

[51] Int. Cl.$^5$ .............................. H01S 3/19
[52] U.S. Cl. .......................... 372/45; 372/46
[58] Field of Search ...................... 372/45, 46

[56] References Cited

U.S. PATENT DOCUMENTS

| | | | |
|---|---|---|---|
| 4,282,494 | 8/1981 | Yonezu et al. | 372/46 |
| 4,635,268 | 1/1987 | Motegi et al. | 372/45 |
| 4,757,510 | 7/1988 | Kaneno et al. | 372/45 |
| 4,862,472 | 8/1989 | Takiguchi et al. | 372/45 |
| 4,881,235 | 11/1989 | Chinone et al. | 372/45 |
| 4,926,431 | 5/1990 | Kawanishi et al. | 372/45 |
| 4,961,197 | 10/1990 | Tanaka et al. | 372/45 |

FOREIGN PATENT DOCUMENTS 63-56983  3/1988  Japan .

OTHER PUBLICATIONS

Yonezu et al., "An AlGaAs Window Structure Laser", IEEE, Journal of Quantum Electronics, vol. QE-15, Aug. 1979, pp. 775-781.

Yang et al., "High-Power Operation . . . (ICPS) Lasers", Electronics Letters, vol. 21, No. 17, 1985, pp. 751-752.

Mawst et al., "Complementary . . . Vapour Deposition", Electronics Letters, vol. 21, No. 20, pp. 903-905, Sep. 1985.

Primary Examiner—Georgia Y. Epps
Attorney, Agent, or Firm—Leydig, Voit & Mayer

[57] ABSTRACT

A double heterojunction semiconductor laser according to the invention includes first and third cladding layers sandwiching an active layer. The third cladding layer includes a mesa opposite a light emitting region of the active layer. The mesa is confined by a current blocking layer. A cap layer that is part of the mesa is used as a dopant diffusion source to dope a light emitting region of the active layer heavily. A second cladding layer may be present between the active layer and third cladding layer having the same conductivity type as the third cladding layer adjacent the light emitting region but the opposite conductivity type elsewhere. A semiconductor laser according to the invention may also include a stripe groove structure. The semiconductor lasers include pnpn structures outside the light emitting region and in window structures adjacent the facets of the semiconductor laser for suppressing leakage currents, thereby increasing laser efficiency and reducing threshold current while increasing power output.

12 Claims, 5 Drawing Sheets

FIG. I(a)
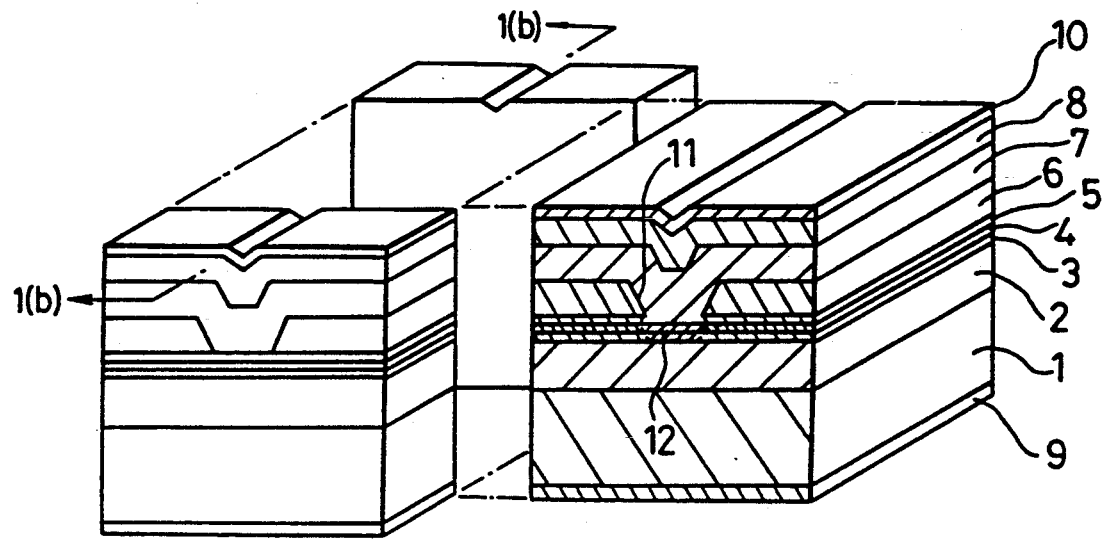
FIG. I(b)
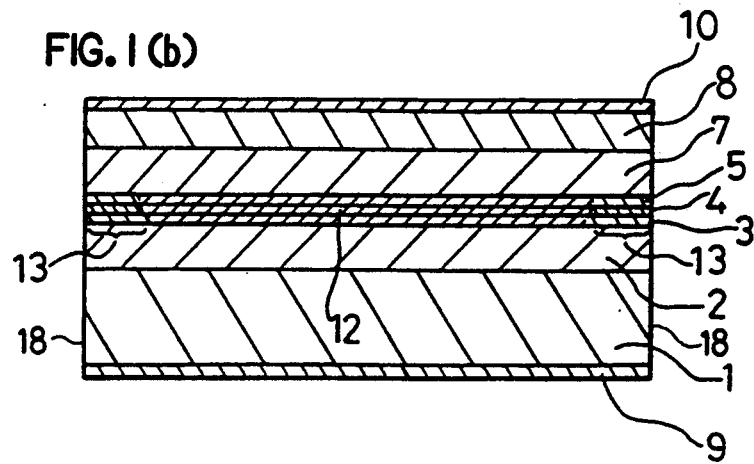

SEMICONDUCTOR LASER

This application is a division of application Ser. No. 586,197, filed Sept. 20, 1990.

FIELD OF THE INVENTION

The present invention relates to a double heterojunction semiconductor laser having increased power output, reduced current leakage, and improved efficiency.

BACKGROUND OF THE INVENTION

In double heterojunction semiconductor lasers, an active layer in which carrier recombination occurs, resulting in the emission of light, is sandwiched between cladding layers of opposite conductivity type. The cladding layers have larger energy band gaps and smaller refractive indices than the active layer in order to confine light within the active layer. The laser structure includes two opposed, generally parallel facets that are generally perpendicular to the active layer. The facets are coated with a reflective material to produce, with the active layer, an optical resonator in which light resonates to sustain a laser oscillation. The coating on at least one of the facets permits some of the laser light to escape, producing the light output of the laser.

A number of factors limit the power output of a semiconductor laser. Carrier recombination can occur more efficiently at the surfaces adjacent the facets than within the body of the laser. The increased carrier recombination and resulting increased charge carrier density at the facets results in increased light absorption there. That light absorption, in turn, increases the temperature at the facets. If the temperature rise is sufficient, localized melting of the semiconductor materials can occur, resulting in catastrophic optical damage (COD) that destroys the laser.

The power output of a semiconductor laser can be increased without risking COD by providing a window structure as described by Yonezu et al in the *Journal of Quantum Electronics*, Volume QE-15, August 1979, pages 775-781, the disclosure of which is incorporated herein by reference. In the window structure described by Yonezu, the regions of the semiconductor laser adjacent the facets, i.e., the windows, are heavily doped n-type and the light emitting region, which lies between the windows in the central portion of the laser, is made p-type by overcompensation with a p-type dopant. As a result of this doping profile, the energy band gap in the central portion of the laser is decreased relative to the energy band gap in the windows. The increased energy band gap in the window structures results in reduced absorption of light near the facets, thereby increasing the power level that can be attained without risk of COD.

Although the window structure increases the power output that can be safely produced by a laser, the relatively high doping concentrations associated with the window structure create other problems. For example, when the dopant concentration is relatively high in the light emitting region where carriers recombine and emit light, there is significant light loss due to free carrier absorption, i.e., the absorption of light by charge carriers. In addition, the relatively heavy dopant concentrations throughout the laser structure encourage the flow of leakage currents between the laser electrodes which are generally parallel to the active layer and transverse to the facets. These leakage currents reduce laser efficiency and effectively raise the current threshold at which laser oscillation begins.

SUMMARY OF THE INVENTION

The present invention is directed to solving the problems of internal light absorption in a double heterojunction semiconductor laser incorporating a window structure and to reducing current leakage in a double heterojunction semiconductor laser, particularly a laser incorporating a window structure.

According to a first aspect of the invention, a semiconductor laser includes a semiconductor substrate of a first conductivity type, a semiconductor first cladding layer of the first conductivity type disposed on the substrate, a semiconductor active layer disposed on the first cladding layer and having a central light emitting region of a second conductivity type opposite the first conductivity type, a semiconductor third cladding layer of the second conductivity type disposed on the active layer including a mesa opposite and projecting away from the light emitting region of the active layer, a semiconductor current blocking layer of the first conductivity type disposed on the third cladding layer and adjacent the mesa, a semiconductor fourth cladding layer of the second conductivity type disposed on the current blocking layer and on the mesa, a semiconductor contacting layer of the second conductivity type disposed on the fourth cladding layer, and first and second electrodes respectively disposed on the substrate and the contacting layer wherein the laser includes generally parallel first and second facets transverse to the first and second electrodes for transmitting laser light outside the laser and a semiconductor cap layer in the mesa adjacent the fourth cladding layer, the cap layer having the first conductivity type proximate the first and second facets and the second conductivity type elsewhere.

A method of manufacturing a semiconductor laser according to the invention includes successively growing a semiconductor first cladding layer of the first conductivity type, a semiconductor active layer, a semiconductor third cladding layer of a second conductivity type opposite the first conductivity type, and a semiconductor cap layer of the first conductivity type on a semiconductor substrate of a first conductivity type, diffusing a dopant producing the second conductivity type into the cap layer except at portions where each of two opposed facets of the semiconductor layer will be formed, thereby converting the cap layer in the diffused portion to the second conductivity type, removing portions of the third cladding layer and the cap layer to leave a mesa including portions of the third cladding layer and the cap layer projecting from a remaining portion of the third cladding layer, heating the substrate, first cladding layer, active layer, and mesa to diffuse the dopant from the cap layer through the mesa and into the active and third cladding layers adjacent the mesa, growing a semiconductor first conductivity type current blocking layer on the third cladding layer abutting the mesa, successively growing a semiconductor fourth cladding layer of the second conductivity type and a semiconductor contacting layer of the second conductivity type on the current blocking and cap layers, depositing first and second electrodes on the substrate and the contacting layer, respectively, and forming a pair of generally parallel opposed facets generally transverse to the first and second electrodes and spaced from the portions of the cap layer into which the dopant was diffused.

According to another aspect of the invention, a semiconductor laser includes a semiconductor substrate of a first conductivity type, a semiconductor first cladding layer of the first conductivity type disposed on the substrate, a semiconductor active layer disposed on the first cladding layer and having a central light emitting region of a second conductivity type opposite the first conductivity type, a semiconductor third cladding layer disposed on the active layer, a semiconductor current blocking layer of the first conductivity type disposed on the third cladding layer, the current blocking layer including an opening extending to the third cladding layer, a semiconductor fourth cladding layer of the second conductivity type disposed on the current blocking layer and on the third cladding layer in the opening in the current blocking layer, a semiconductor contacting layer of the second conductivity type disposed on the fourth cladding layer, and first and second electrodes respectively disposed on the substrate and the contacting layer wherein the laser includes generally parallel first and second facets transverse to the first and second electrodes for transmitting laser light outside the laser, the third cladding layer is of the second conductivity type opposite the light emitting region of the active layer and of the first conductivity type proximate the facets and elsewhere outside the light emitting region of the active layer.

Another method of manufacturing a semiconductor laser according to the invention includes successively growing a semiconductor first cladding layer of the first conductivity type, a semiconductor active layer, a semiconductor second cladding layer of the first conductivity type, a semiconductor third cladding layer of a second conductivity type opposite the first conductivity type, and a semiconductor current blocking layer of the first conductivity type on a semiconductor substrate of a first conductivity type, forming a diffusion mask including a central opening on the current blocking layer, the mask covering portions of the semiconductor layers proximate the locations where facets of the laser will be formed, diffusing a dopant producing the second conductivity type through the opening in the diffusion mask into the current blocking layer, heating the substrate, first cladding layer, active layer, second and third cladding layers, and current blocking layer to diffuse the dopant from the third cladding layer through the second cladding layer and into the active layer, removing the diffusion mask and depositing on the current blocking layer an etching mask having a central opening extending to the locations where the facets of the semiconductor laser will be formed and aligned with the location of the opening of the diffusion mask, removing the portion of the current blocking layer not covered by the etching mask by etching, removing the etching mask, successively growing a semiconductor fourth cladding layer of the second conductivity type and a semiconductor contacting layer of the second conductivity type on the current blocking layer and on the third cladding layer where a portion of the current blocking layer was removed, depositing first and second electrodes on the substrate and the contacting layer, respectively, and forming a pair of generally parallel opposed facets generally transverse to the first and second electrodes spaced from the portions of the second cladding layer into which the dopant was diffused.

Other objects and advantages of the present invention will become apparent from the detailed description given hereinafter. The detailed description is given by way of illustration only, since various additions and modifications within the spirit and scope of the invention will be apparent to those skilled in the art.

BRIEF DESCRIPTION OF THE DRAWINGS

FIG. 1(a) is a perspective view of a semiconductor laser according to the invention with the central portion of the laser shown in cross-section;

FIG. 1(b) is a sectional side view taken along line 1(b)—1(b) of FIG. 1(a);

DETAILED DESCRIPTION OF PREFERRED EMBODIMENTS

Figure 2A:
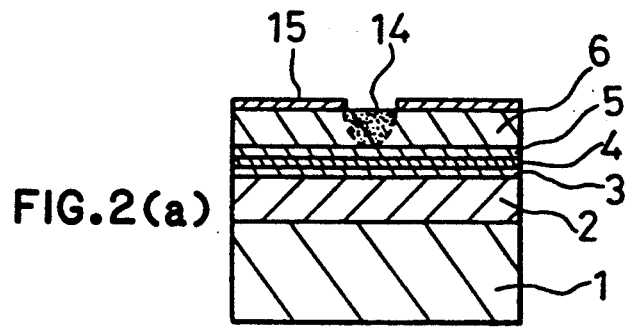
FIGS. 2(a)–2(d) are central cross-sectional views illustrating steps in a method for manufacturing the semiconductor laser of FIG. 1(a)

A double heterojunction semiconductor laser according to an embodiment of the invention is shown in a perspective view in FIG. 1(a). In order to illustrate the internal structure of the laser, in FIG. 1(a), the central portion of the laser has been separated and moved to the right, away from the end sections of the laser. The end sections include the facets and are different from the central portion of the laser because of the presence of the window structures. In FIG. 1(b), a side sectional view of the laser of FIG. 1(a) taken along line 1(b)—1(b) of FIG. 1(a) is shown to illustrate further the window structures.

In FIGS. 1(a) and 1(b), an n-type gallium arsenide substrate 1 has a number of semiconductor layers successively disposed on it, forming the laser structure. Those layers are a first cladding layer 2 of n-type aluminum gallium arsenide, an active layer 3 of gallium arsenide, a second cladding layer 4 of n-type aluminum gallium arsenide, and a third cladding layer 5 of p-type aluminum gallium arsenide. A current blocking layer 6 of n-type gallium arsenide is disposed on part of the third cladding layer.

The double heterojunction laser of FIGS. 1(a) and 1(b) has a stripe groove-type construction. A stripe groove 11 extends through the current blocking layer 6 and exposes the third cladding layer 5 from one facet 18 to the other. A fourth cladding layer 7 of p-type aluminum gallium arsenide is disposed on the current blocking layer and in the stripe groove 11 in contact with the third cladding layer 5. A contacting layer 8 of p-type gallium arsenide is disposed on the fourth cladding layer 7. Electrodes 9 and 10 are respectively disposed on the substrate 1 opposite the other semiconductor layers and on contacting layer 8 to complete the laser.

In the structure as described, three pn rectifying junctions are present between the electrodes 9 and 10 along a current path through the current blocking layer 6. One pn junction is present between the fourth cladding layer 7 and the current blocking layer 6 where those two layers are in contact, and a second pn junction is present between the current blocking layer 6 and the third cladding layer 5 where those two layers are in contact. Finally, a third rectifying junction is present between the second and third cladding layers 4 and 5. Leakage current flows, i.e., current flows other than through the active layer 3 at the stripe groove 11, are strongly suppressed by these three pn junctions. A current path between the electrodes 9 and 10 passing through the stripe groove 11 and the as deposited layers includes only one pn junction between second and third cladding layers 4 and 5 that lies on the side of the active layer toward electrode 10.

In the laser structure of FIG. 1(a), the pn junction between the second and third cladding layers is eliminated only in the vicinity of the stripe groove 11 and only in the central portion of the laser by a dopant that produces p-type conductivity. That dopant is disposed in the active and second and third cladding layers opposite the stripe groove 11 in a region 12 in FIG. 1(a). The p-type dopant overcompensates the second cladding layer 4, converting it to p-type conductivity in region 12 opposite stripe groove 11 in the central portion of the laser. Thereby, in the central portion of the laser there exists a current path between electrodes 9 and 10 in which only one pn junction, which sandwiches the active layer 3, is present. That pn junction, when properly biased, produces carrier recombinations that result in laser light generation.

As clearly shown in sectional side view in FIG. 1(b), region 12 is limited to the central portion of the laser. At each end of region 12, adjacent one of the facets 18 in a window region 13, the p-type dopant that overcompensates second cladding layer 4 is absent from that layer and layers 3 and 5. The absence of the overcompensating p-type dopant from the window regions reduces current flow, surface recombination, and light absorption so that the laser can produce higher output power, without COD, than is possible when the window structures are absent.

A method for manufacturing the laser structure of FIGS. 1(a) and 1(b) is illustrated in FIGS.

A double heterojunction semiconductor laser 2(a)-2(d). Each of those figures is a cross-sectional view taken in the central portion of the laser. The diffusion steps illustrated in FIGS. 2(a) and 2(b) in which p-type impurities are disposed in the active layer and second and third cladding layers do not take place in the window regions 13 adjacent facets 18.

Turning to FIG. 2(a), the first cladding layer 2, the active layer 3, the second and third cladding layers 4 and 5, and a current blocking layer 6 are successively grown by a known process, such as metal organic chemical vapor deposition (MOCVD), molecular beam epitaxy (MBE), liquid phase epitaxy (LPE), or the like. At this stage, the stripe groove 11 is not yet formed in current blocking layer 6. Thereafter, a film 15 that is effective as a diffusion mask against p-type impurities that will be diffused into the precursor of the laser structure is deposited on the current blocking 6. When the p-type dopant is zinc, silicon nitride deposited in a thermal chemical vapor deposition process may be employed as the film 15. After the deposition of the film 15, a central aperture is opened in it as indicated in FIG. 2(a). That aperture is not present in the window regions. Since the laser facets are usually formed after the laser structure is complete, the aperture in the diffusion mask is generally rectangular with the short ends of the rectangle spaced from the locations where the laser facets 18 will be subsequently formed.

In the specific embodiment described, zinc is diffused through the diffusion mask aperture into and penetrating the current blocking layer 6. The source of the zinc atoms may be a vapor or a solid phase diffusion source, such as a film containing a mixture of zinc compound and another compound, for example, zinc oxide and silicon dioxide. In the illustrated method, a vapor phase zinc source is employed. The precursor of the laser structure, usually in a wafer form, is heated in a sealed quartz ampoule in the presence of zinc arsenide and elemental zinc to about 700° C., vaporizing the zinc. The zinc arsenide provides an excess arsenic pressure that protects the compound semiconductor layers including arsenic from deterioration. The zinc concentration in the current blocking layer opposite the diffusion mask aperture reaches about $1 \times 10^{20}$ cm$^{-3}$. The resulting high p-type dopant concentration is undesirable in the completed laser because it strongly encourages free carrier absorption, resulting in light losses as already described. In keeping with achieving that goal, the time and temperature of the diffusion, considering the thickness of the current blocking layer 6, are limited so that the diffusion front of zinc in this first diffusion step does not reach the second cladding layer 4.

In order to convert the portion of the second cladding layer 4 opposite the aperture in the diffusion mask film 15 from n-type to p-type, zinc must be further diffused to penetrate that layer. That diffusion is accomplished in a drive-in diffusion step. That drive-in diffusion is carried out at a higher temperature, for example, approximately 900° C., that the first diffusion in an arsenic atmosphere. The arsenic is necessary to avoid deterioration of the exposed surface of the gallium arsenide current blocking layer 6. As a result of this second diffusion, some of the zinc present in the current blocking layer 6 reaches and penetrates the second and third cladding layers 4 and 5, opposite the aperture in the diffusion mask film 15, and also enters the active layer 3. The resulting zinc impurity concentration in region 12 is approximately $10^{18}$ to $10^{19}$ cm$^{-3}$.

In order to expose the third cladding layer for deposition of the fourth cladding layer, the zinc diffused region 14 within the current blocking layer must be removed. The diffusion mask film 15 covers the window regions of the structure. However, to produce the desired laser structure, the stripe groove 11 must extend the full length of the laser resonator, i.e., completely between facets 18. Therefore, the diffusion mask is not suitable as an etching mask for forming the stripe groove and is removed. A photoresist film 16 is deposited on current blocking layer 6 and a central aperture is opened in it, fully extending between the facet locations and aligned with the region 14 in which zinc has been diffused. As shown in FIG. 2(c), the stripe groove 11 is formed by selectively etching the gallium arsenide current blocking layer 6 through the aperture in the photoresist film 16 without substantially etching the aluminum gallium arsenide third cladding layer 5. Thereby, the most highly doped zinc diffusion region 14 that would produce free carrier absorption and light loss in the completed laser is removed.

The laser is completed by removing the etching mask 16 and successively growing the fourth cladding layer 7 and the contacting layer 8 using MOCVD, MBE, LPE, or the like. Electrodes 9 and 10 are applied to opposite sides of the device and the facets 18 are formed, for example, by cleaving at the preselected locations to preserve the window structure at the opposite ends of the double heterojunction semiconductor laser.

The laser of FIG. 1(a) provides improved performance. When forward biased, relatively high power laser light can be produced by the laser without damage to the facets because of the window structure. In addition, leakage currents, i.e., currents flowing between electrodes 9 and 10 other than through the active layer at the stripe groove, are suppressed. The only current paths between the electrodes outside the stripe groove include a pnpn structure, i.e., three rectifying junctions, that is highly effective in concentrating the current flow in the stripe groove region. A pn junction is present in the stripe groove 11 between second third cladding layers 4 and 5 in the window regions 13. That junction is electrically connected in parallel with the relatively heavily doped p-type region 12. Therefore, current flow at the facets 18 through the stripe groove and a rectifying junction is suppressed in favor of a flow through the single conductivity type region 12, further discouraging current leakage. The improved current concentration achieved in the laser structure of FIG. 1(a) reduces the threshold current at which laser oscillation occurs and increases laser efficiency.

Figure 2B:
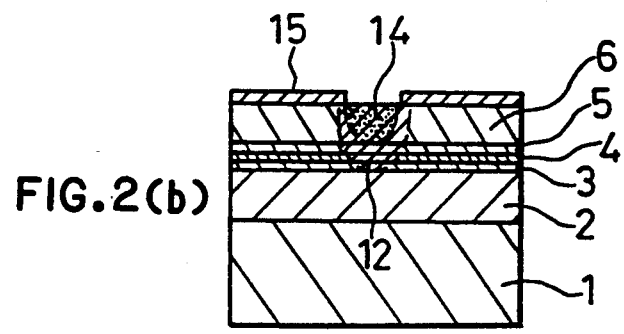
Figure 2C:
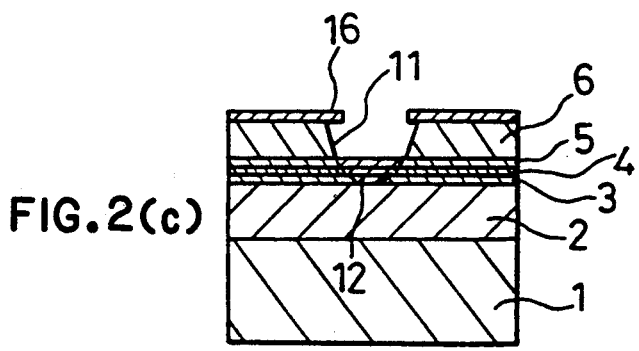
Figure 2D:
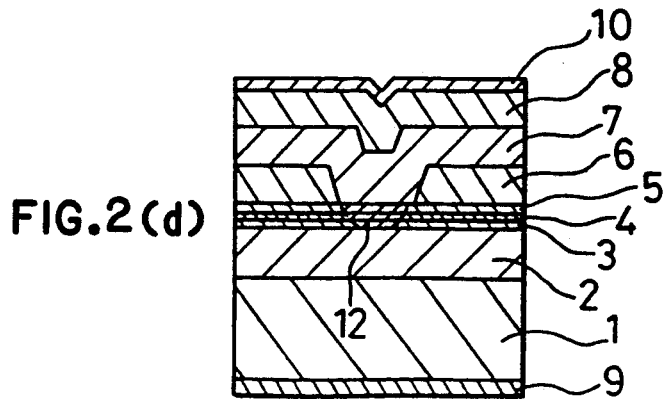

In the manufacturing steps illustrated in FIGS. 2(b) and 2(c), it is important to align the aperture of the etching mask formed with film 16 with the former location of the aperture of the diffusion mask formed with film 15. The alignment is desirable to ensure that all of the highly doped zinc region 14 in the current blocking layer 6 is removed when the stripe groove is formed. Preferably, the aperture in the etching mask is wider than the aperture in the diffusion mask to ensure that any portion of the current blocking layer in which zinc has laterally diffused is removed in the etching step. If these conditions are not met, the effectiveness of the structure in concentrating the current flow through the active layer only at the stripe groove is reduced.

Figure 3A:
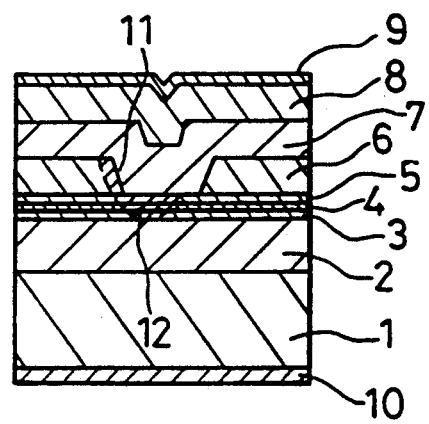
FIGS. 3(a) and 3(b) are central cross-sectional views of the laser structure of FIG. 1(a) illustrating defects that may occur during manufacture.
Figure 3B:
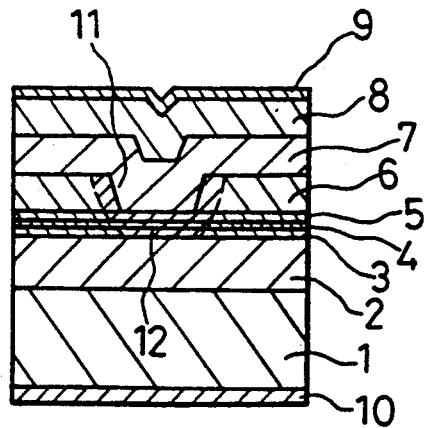

FIGS. 3(a) and 3(b) illustrate the structures that can result when desired alignment between the diffusion and etching masks is not achieved. In FIG. 3(a), there has been a slight misalignment between the apertures of the diffusion and etching masks. As a result, a residual portion of the highly doped zinc region 14 has been left in part of the current blocking layer adjacent the stripe groove 11. A current leakage path is thereby provided, resulting in a non-linear relationship between light output and the current flowing through the laser as well as reduced efficiency. In FIG. 3(b), the aperture in the etching mask was smaller than the aperture in the diffusion mask. As a result, residual portions of the highly doped region 14 are left at each side of the stripe groove in the current blocking layer 6. These two p-type regions provide a still larger current leakage path than in the structure of FIG. 3(a), again resulting in lowered laser efficiency as well as non-linearity between laser current and light output.

In forming the stripe groove 11 in the process step illustrated in FIG. 2(c), the aluminum gallium arsenide third cladding layer 5 is exposed to the ambient. That exposure may result in the oxidation of the exposed aluminum in the third cladding layer 5. The oxidation at the regrowth interface may interfere with the deposition of the fourth cladding layer. The potentially oxidized surface is positioned directly opposite the stripe groove where current is concentrated for the laser oscillation. This close proximity of an oxidized layer to the light emitting region may cause premature deterioration of the semiconductor laser.

Figure 4A:
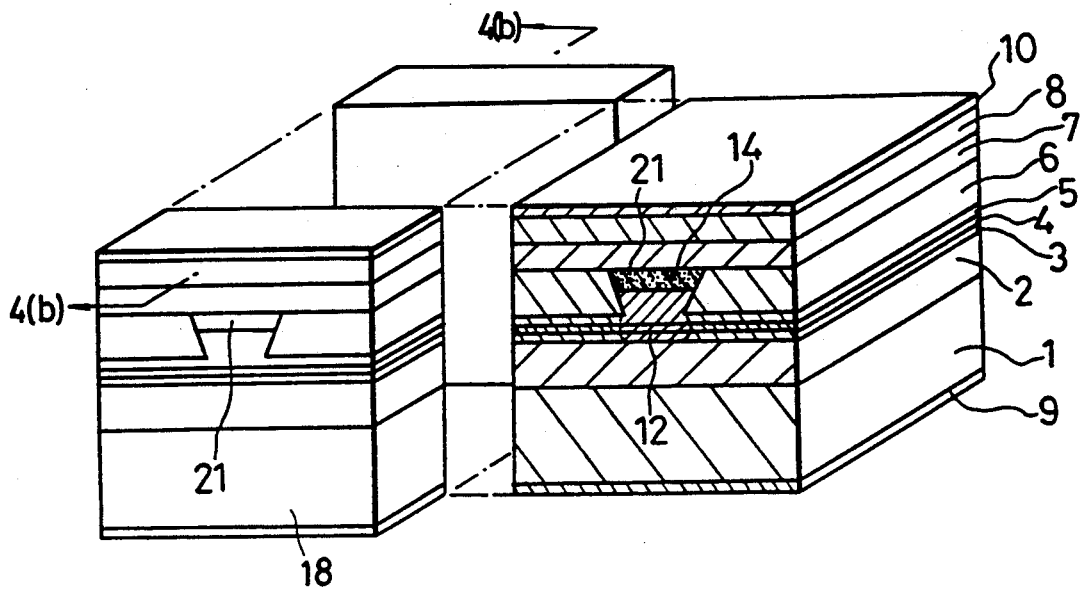
FIG. 4(a) is a perspective view of a semiconductor laser according to another embodiment of the invention with the central portion of the laser shown in cross-section.
Figure 4B:
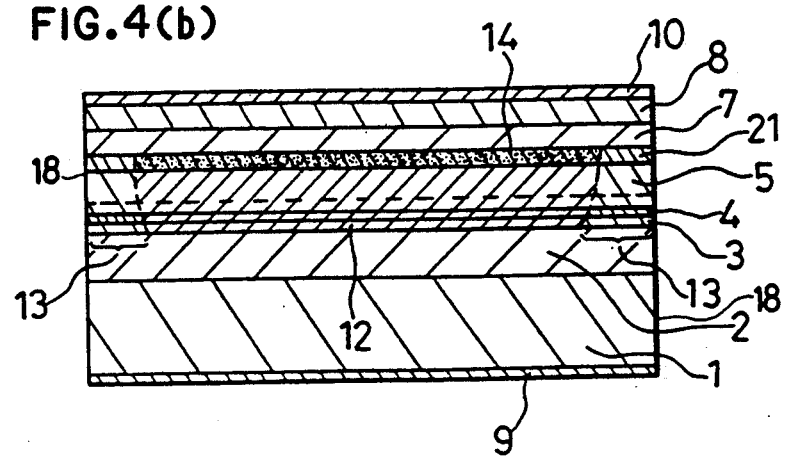
FIG. 4(b) is a sectional side view taken along line 4(b)—4(b) of FIG. 4(a)

A second embodiment of the invention is shown in perspective and sectional views in FIG. 4(a) and in a side sectional view in FIG. 4(b). In this embodiment, there is no regrowth interface subject to oxidation located near the light emitting region or through which a concentrated current flows for producing laser light. Moreover, the possibility of a leakage current path in the current blocking layer resulting from misalignment of mask apertures is eliminated.

In FIGS. 4(a)-5(g), the same elements are given the same reference numbers as in FIGS. 1(a)-2(d). Therefore, it is not necessary to identify again the elements that have already been described with respect to the other figures.

The double heterojunction laser embodiment of FIG. 4(a) employs a reverse mesa structure rather than the stripe groove structure of the laser embodiment of FIG. 1(a). The reverse mesa includes side walls that converge when moving in the direction from the electrode 10 toward the active layer 3. The reverse mesa is an extension of the third cladding layer 5 and is disposed within an opening in the current blocking layer 6. The reverse mesa includes, in the central portion of the laser, a relatively highly doped region 14 containing a dopant producing p-type conductivity. In addition, a cap layer 21 of n-type gallium arsenide in the window regions 13, but overcompensated to p-type in the central portion of the laser, is present at the top of the reverse mesa, i.e., sandwiched between the mesa and the fourth cladding layer 7 and by the current blocking layer 6. As in the embodiment shown in FIG. 1(a), a p-type region 12 is present in the active layer 3 in the light emitting region in the central portion of the laser but not in the window structures adjacent the facets of the laser. The laser embodiment of FIG. 4(a) includes, outside the light emitting region, both in the central portion of the laser and at the facets 18, a pnpn structure that is effective in concentrating current flow in the light emitting region and reducing leakage currents that may flow between the electrodes 9 and 10 outside that light emitting region.

Figure 5A:
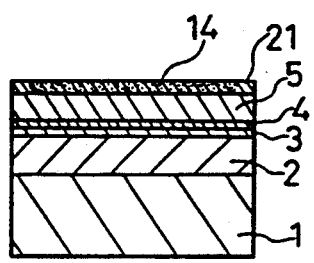
FIG. 5(a) is a sectional side view of a precursor for making a laser having the structure shown in FIG. 4(a)

A method for manufacturing the double heterojunction semiconductor laser of FIG. 4(a) is illustrated in FIGS. 5(a)-5(g). FIG. 5(a) is a side sectional view, like FIG. 4(b), whereas FIGS. 5(b)-5(g) are transverse sectional views taken in the central portion of the laser structure. Turning to FIG. 5(a), the n-type aluminum gallium arsenide first cladding layer 2, the gallium arsenide active layer 3, the n-type aluminum gallium arsenide second cladding layer 4, and the p-type aluminum gallium arsenide third cladding layer 5 are successively grown using a known process, such as MOCVD, MBE, or LPE. Unlike the structure illustrated in FIG. 2(a), in FIG. 5(a), the third cladding layer 5 is relatively thick, for example, 1.5 to 2 microns thick. The increased thickness is required for the formation of the mesa structure, as explained below. An n-type gallium arsenide cap layer 21 is grown on the third cladding layer 5 as the final step in the initial growth process.

After the initial growth process, as illustrated in FIG. 5(a), a p-type dopant, such as zinc, is diffused into the cap layer 21 except at the window regions 13 at opposite ends of the structure where facets 18 are to be formed. Although not illustrated in FIG. 5(a), a diffusion mask, such as a silicon nitride layer with a rectangular aperture exposing the central portion of the cap layer 21, while protecting the regions at which the facets 18 will be formed, is disposed on the cap layer before the diffusion step. The zinc dopant may be supplied in a vapor form through the aperture or from a solid diffusion source disposed on the cap layer 21 and produces a relatively high p-type dopant concentration within the cap layer 21 except at the facet regions. Unlike the zinc diffusion mask and step described with respect to FIG. 2(a), the opening in the diffusion mask need not be limited transversely, i.e., along a direction parallel to the facets 18 and the active layer 3, to the central portion of the laser structure. Because the cap layer 21 is subsequently removed between the facets, except opposite the light emitting region, it is not necessary to protect those other areas of cap layer 21 from zinc. It is only necessary to protect from zinc the regions at which the facets will be formed in order to produce the window structures.

Following the zinc diffusion, the diffusion mask is removed and an additional mask 22 is applied. Mask 22 may be silicon nitride and extends longitudinally in the direction between and beyond the two facets, i.e., to and covering the window regions 13. The silicon nitride film 22 is formed by a conventional process, such as a thermally driven chemical vapor deposition process, and patterned by conventional photolithographic and selective etching steps. Initially, the mask 22 is employed as an etching mask. Where not protected by etching mask 22, the third cladding layer 5 is selectively etched to leave reverse mesa 23 in place. As is well known in the art, this reverse mesa structure can be obtained by proper crystallographic orientation of the substrate 1 and use of a crystallographically preferential etch. For example, the substrate orientation may be (100) and a reverse mesa may be formed along the <011> direction by use of an etch that is an aqueous solution of sulfuric acid and hydrogen peroxide. The manufacturing steps of FIGS. 5(b)-5(g) and the structure shown in FIG. 4(a) employ a reverse mesa structure which is preferred However, the invention also encompasses a forward mesa structure in the <01$\bar{1}$> direction. In a forward mesa, the side walls diverge, moving in the direction from electrode 10 toward the active layer 3.

The etching step in the formation of mesa 23 exposes surfaces of aluminum gallium arsenide layer 5 that are subject to oxidation. However, as will be described below, the concentrated current flow that passes through the active layer to produce laser oscillation does not pass through those oxidized surfaces. In other words, the potentially oxidized surfaces are remote from the light emitting region so that they do not produce premature deterioration of the semiconductor laser.

Figure 5E:
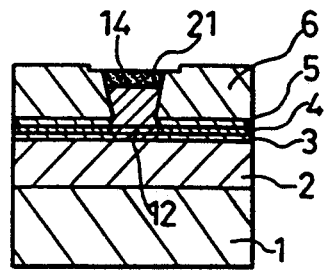
FIGS. 5(b)–5(g) are central cross-sectional views illustrating, in conjunction with FIG. 5(a), a method for manufacturing the laser of FIG. 4(a).
Figure 5B:
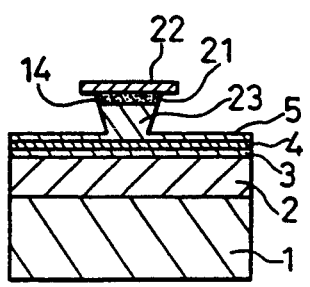
Figure 5F:
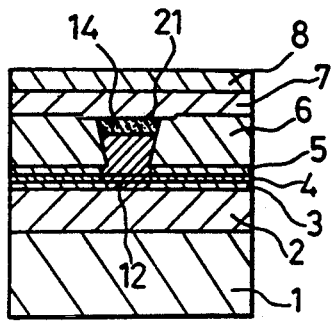
Figure 5C:
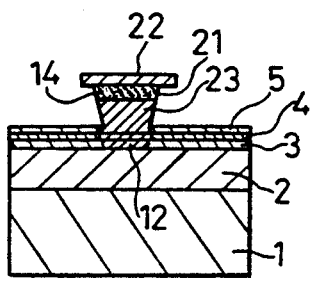

The relatively heavily doped region 14 provides a diffusion source for a drive-in diffusion step illustrated in FIG. 5(c). During the drive-in diffusion process, as in the initial diffusion doping region 14, an excess pressure of arsenic is employed to avoid deterioration of the gallium arsenide and the aluminum gallium arsenide layers. During the drive-in diffusion, zinc diffuses from region 14 under mask 22 through mesa 23, i.e., third cladding layer 5, into second cladding layer 4 and active layer 3. Lateral diffusion of the dopant atom is prevented by the side walls of the reverse mesa 23. As a result, the misalignments illustrated in FIGS. 3(a) and 3(b) between zinc diffusions and current blocking layers cannot occur in the step illustrated in FIG. 5(c) and the doped region 12 at the active layer 3 is precisely aligned with the base of the reverse mesa 23. During this drive-in diffusion step, mask 22 protects the top surface of the cap layer from damage or deterioration.

Figure 5G:
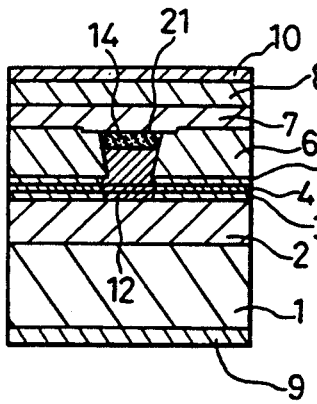
Figure 5D:
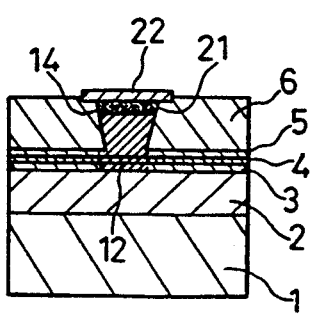

Following the drive-in diffusion, as illustrated in FIG. 5(d), the n-type current blocking layer 6 is grown by MOCVD on the third cladding layer 5 including abutting the side walls of the reverse mesa 23 and on the longitudinal surfaces of third cladding layer 5 that were exposed during the etching step. The current blocking layer 6 is grown to a sufficient height to bury the reverse mesa but not the silicon nitride film 22 on which there is no deposition of gallium arsenide when the MOCVD process is used.

Turning to FIG. 5(e), the silicon nitride film 22 is removed by selective etching, exposing the cap layer 21. Thereafter, as shown in FIG. 5(f), the fourth cladding layer 7 of p-type aluminum gallium arsenide and the contacting layer 8 of p-type gallium arsenide are successively grown by MOCVD or another conventional process on the cap layer 21 and current blocking layer 6. Finally, metal electrodes 9 and 10 are deposited on substrate 1 and contacting layer 8, respectively.

In the structure of FIGS. 4(a) and 5(g), the only regrowth interface through which current producing laser oscillations flows is between cap layer 21 and fourth cladding layer 7. That interface is not susceptible to oxidation because cap layer 21 does not contain aluminum. That interface is relatively widely separated from the light emitting region by at least the thickness of the current blocking layer 6, i.e., about the same separation as the original thickness of third cladding layer 5, 1.5 to 2 microns. In the stripe groove structure of FIG. 2(d), the regrowth interface between third cladding layer 5 and fourth cladding layer 7 is separated from the active layer 3 only by the thickness of second and third cladding layers 4 and 5, a much smaller distance than in the structure of FIG. 5(g).

The operation of the structure of FIGS. 4(a) and 5(g) is essentially the same as that of the structure of FIG. 1(a). Both structures provide increased power output without facet damage because of the window structure. In addition, both structures have reduced threshold currents for laser oscillation and increased current efficiency because of the pnpn structure outside the light emitting region of the active layer that suppresses leakage currents and enhances the concentration of current flow through the light emitting region of the active layer. In addition, in the structure of FIG. 4(a), a pnpn structure is also present at each of the window regions in a current path passing through the reverse mesa. The n-type cap layer 21 retains its n-type conductivity proximate the facets in the window structures since it is protected from the diffusion step establishing the p-type region 14 and is not affected by the drive-in diffusion step. The cap layer 21 produces the additional pn junctions in the window region at the mesa. Therefore, a further improvement in concentrating the current flow through the active layer at the light emitting region and suppressing leakage currents is achieved in the structure of FIG. 4(a) compared to the structure of FIG. 1(a).

The described structures employ gallium arsenide as the active layer 3. However, if shorter wavelength light laser is desired, the active layer 3 may be aluminum gallium arsenide. The zinc diffusion step illustrated in FIGS. 2(a) and 5(a) may employ a solid source of dopant, such as a zinc oxide film or a film of zinc oxide mixed with another material, such as silicon dioxide. After the initial diffusion, a solid diffusion source is removed by etching. Dopant atoms other than zinc producing p-type conductivity in compound semiconductors, such as cadmium, magnesium, and beryllium, may be employed in place of zinc. In addition, compound semiconductor materials other than those described here, such as indium gallium arsenide phosphide or aluminum gallium indium phosphide, may be employed. When these materials are used, the proportions of various components are adjusted in the semiconductor layers to produce a double heterojunction structure including an active layer of smaller energy band gap and larger refractive index than the cladding layers in order to obtain light confinement and laser oscillation.

In the structures described, the second cladding layer 4 is preferably included because it adds a pn junction that assists in confining current flow to the light emitting region of the active layer, reducing leakage currents, increasing laser efficiency, and reducing the threshold current. However, the second cladding layer 4 is not essential to every embodiment of the invention.

We claim:

1. A semiconductor laser comprising:
   a semiconductor substrate of a first conductivity type;
   a semiconductor first cladding layer of the first conductivity type disposed on said substrate;
   a semiconductor active layer disposed on said first cladding layer and having a central light emitting region of a second conductivity type opposite the first conductivity type;
   a semiconductor third cladding layer of the second conductivity type disposed on said active layer including a mesa opposite and projecting away from the light emitting region of said active layer;
   a semiconductor current blocking layer of the first conductivity type disposed on said third cladding layer and adjacent said mesa;
   a semiconductor fourth cladding layer of the second conductivity type disposed on said current blocking layer and on said mesa;
   a semiconductor contacting layer of the second conductivity type disposed on said fourth cladding layer; and
   first and second electrodes respectively disposed on said substrate and said contacting layer wherein said laser includes generally parallel first and second facets transverse to said first and second electrodes for transmitting laser light outside said laser and a semiconductor cap layer in said mesa adjacent said fourth cladding layer, said cap layer having the first conductivity type proximate said first and second facets and the second conductivity type elsewhere.

2. The semiconductor laser of claim 1 including a semiconductor second cladding layer interposed between said active layer and said third cladding layer, said second cladding layer being of the second conductivity type opposite the light emitting region of said active layer and of the first conductivity type elsewhere.

3. The semiconductor laser of claim 1 wherein the first conductivity type is n-type and the second conductivity type is p-type.

4. The semiconductor laser of claim 1 wherein said first, third, and fourth cladding layers are aluminum gallium arsenide and said cap layer is gallium arsenide.

5. The semiconductor laser of claim 4 wherein said active layer is gallium arsenide.

6. The semiconductor laser of claim 1 wherein said mesa is a reverse mesa that is relatively narrow proximate said active layer and relatively wide adjacent said fourth cladding layer.

7. A semiconductor laser comprising:
   first and second opposed electrodes;
   a plurality of successively disposed semiconductor layers disposed between said first and second electrodes including an n-type first cladding layer and a p-type second cladding layer sandwiching an active layer having a central light emitting region; and
   a pair of opposed generally parallel facets transverse to said first and second electrodes for transmitting light out of said laser wherein said plurality of layers forms a pnpn structure between said electrodes proximate each of said facets for suppressing current flow between said electrodes in said laser outside the central light emitting region.

8. A semiconductor laser comprising:
   a semiconductor substrate of a first conductivity type;
   a semiconductor first cladding layer of the first conductivity type disposed on said substrate;
   a semiconductor active layer disposed on said first cladding layer and having a central light emitting region of a second conductivity type opposite the first conductivity type;
   a semiconductor third cladding layer disposed on said active layer;
   a semiconductor current blocking layer of the first conductivity type disposed on said third cladding layer, said current blocking layer including an opening extending to said third cladding layer;
   a semiconductor fourth cladding layer of the second conductivity type disposed on said current blocking layer and on said third cladding layer in the opening in said current blocking layer;
   a semiconductor contacting layer of the second conductivity type disposed on said fourth cladding layer; and
   first and second electrodes respectively disposed on said substrate and said contacting layer wherein said laser includes generally parallel first and second facets transverse to said first and second electrodes for transmitting laser light outside said laser, said third cladding layer is of the second conductivity type opposite the light emitting region of said active layer and of the first conductivity type proximate said facets and elsewhere outside the light emitting region of said active layer.

9. The semiconductor laser of claim 8 wherein the first conductivity type is n-type and the second conductivity type is p-type.

10. The semiconductor laser of claim 8 wherein said first, third, and fourth cladding layers are aluminum gallium arsenide and said contacting layer is gallium arsenide.

11. The semiconductor laser of claim 8 wherein said active layer is gallium arsenide.

12. A semiconductor laser comprising:
    first and second opposed electrodes;
    a plurality of successively disposed semiconductor layers disposed between said first and second electrodes including an n-type first cladding layer and a p-type second cladding layer sandwiching an active layer having a central light emitting region; and a pair of opposed generally parallel facets transverse to said first and second electrodes for transmitting light out of said laser wherein said plurality of layers forms a pnpn structure between said electrodes proximate each of said facets outside the central light emitting region for suppressing current flow between said electrodes proximate each of said facets outside the central light emitting region.

* * * * *